US012571984B2

(12) United States Patent
Thomas et al.

(10) Patent No.: US 12,571,984 B2
(45) Date of Patent: Mar. 10, 2026

(54) LIGHT WAVE PHASE INTERFERENCE IMPROVEMENT OF DIGITAL MICROMIRROR DEVICE BY MEANS OF MECHANICALLY STRESSING THE DEVICE PACKAGE

(71) Applicant: Applied Materials, Inc., Santa Clara, CA (US)

(72) Inventors: Timothy N. Thomas, Portland, OR (US); Robert Jordan Lear, Portland, OR (US); Douglas E. Holmgren, Portland, OR (US); Assaf Kidron, Cupertino, CA (US); Nigel Swehla, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 345 days.

(21) Appl. No.: 18/020,169

(22) PCT Filed: Sep. 10, 2021

(86) PCT No.: PCT/US2021/049849
§ 371 (c)(1),
(2) Date: Feb. 7, 2023

(87) PCT Pub. No.: WO2022/060635
PCT Pub. Date: Mar. 24, 2022

(65) Prior Publication Data
US 2023/0221521 A1 Jul. 13, 2023

Related U.S. Application Data

(60) Provisional application No. 63/079,986, filed on Sep. 17, 2020.

(51) Int. Cl.
*G02B 7/182* (2021.01)
*F16B 5/02* (2006.01)
(Continued)

(52) U.S. Cl.
CPC ............ *G02B 7/182* (2013.01); *F16B 5/0258* (2013.01); *F16B 5/0266* (2013.01);
(Continued)

(58) Field of Classification Search
CPC ... G02B 7/182; G02B 26/0833; F16B 5/0258; F16B 5/0266; G03B 21/008; G03B 21/16; G03F 7/70191
(Continued)

(56) References Cited

U.S. PATENT DOCUMENTS 7,092,141 B2 * 8/2006 Kim ....................... F16C 11/12
359/290
7,605,962 B2 10/2009 Yoder et al.
(Continued)

FOREIGN PATENT DOCUMENTS

CN 206517742 U 9/2017
JP 2007529784 A 10/2007
(Continued)

OTHER PUBLICATIONS

Office Action for Chinese Application No. 202180062574.X dated May 29, 2025.
(Continued)

*Primary Examiner* — Toan Ton
(74) *Attorney, Agent, or Firm* — Patterson + Sheridan, LLP

(57) ABSTRACT

Embodiments of the present disclosure relate to mount apparatuses for digital micromirror devices of digital lithography systems and methods of mounting the digital micromirror devices. The mount apparatuses described herein retain spatial light modulators, such as DMDs. The mount apparatus enables the flattening of the DMD by providing a force such that the pair of contact pads contact the DMD. The DMD is positioned in a mounting frame of the mount
(Continued)

apparatus. Contact pads of the mounting frame are operable to apply pressure to the DMD.

19 Claims, 5 Drawing Sheets

(51) Int. Cl.

| | |
|---|---|
| *G02B 26/08* | (2006.01) |
| *G03B 21/00* | (2006.01) |
| *G03B 21/16* | (2006.01) |
| *G03F 7/00* | (2006.01) |

(52) U.S. Cl.
CPC ....... *G02B 26/0833* (2013.01); *G03B 21/008* (2013.01); *G03B 21/16* (2013.01); *G03F 7/70191* (2013.01)

(58) Field of Classification Search
USPC ......................................................... 353/52
See application file for complete search history.

(56) References Cited

U.S. PATENT DOCUMENTS

| | | | |
|---|---|---|---|
| 7,952,178 | B2 | 5/2011 | Rancuret et al. |
| 2003/0020882 | A1 | 1/2003 | Kalyandurg et al. |
| 2006/0132888 | A1 | 6/2006 | Kim et al. |
| 2006/0227514 | A1 | 10/2006 | Kang et al. |
| 2008/0225185 | A1 | 9/2008 | Yoder et al. |
| 2009/0135564 | A1 * | 5/2009 | Chen .................. H05K 7/20472 |
| | | | 361/709 |
| 2017/0255006 | A1 | 9/2017 | Hou et al. |
| 2019/0025542 | A1 | 1/2019 | Zirilli et al. |
| 2019/0179217 | A1 | 6/2019 | Tang et al. |
| 2020/0073253 | A1 | 3/2020 | Johnson et al. |

FOREIGN PATENT DOCUMENTS

| | | | | |
|---|---|---|---|---|
| JP | 2007328065 A | 12/2007 | | |
| JP | 2010175583 A | 8/2010 | | |
| JP | 2013117629 A | 6/2013 | | |
| JP | 2015204320 A | 11/2015 | | |
| WO | WO-2004109342 A2 * | 12/2004 | .......... | H04N 5/7441 |
| WO | 2005094087 A1 | 10/2005 | | |
| WO | 2018090613 A1 | 5/2018 | | |

OTHER PUBLICATIONS

Search Report for Chinese Application No. 202180062574.X dated May 26, 2025.

International Search Report and Written Opinion for International Application No. PCT/US2021/049849 dated Jan. 3, 2022.

Office Action for Korean Application No. 10-2023-7012523 dated Nov. 15, 2024.

Office Action for Japanese Application No. 2023-516676 dated Apr. 16, 2024.

Office Action for Taiwan Application No. 110134560 dated Mar. 18, 2025.

Search Report for Taiwan Application No. 110134560 dated Mar. 14, 2025.

* cited by examiner

LIGHT WAVE PHASE INTERFERENCE IMPROVEMENT OF DIGITAL MICROMIRROR DEVICE BY MEANS OF MECHANICALLY STRESSING THE DEVICE PACKAGE

BACKGROUND

Field

Embodiments of the present disclosure generally relate to methods and apparatuses for processing one or more substrates, and more specifically relate to mount apparatuses for digital micromirror devices of digital lithography systems and methods of mounting the digital micromirror devices.

Description of the Related Art

Spatial light modulators are often used to impose a spatial varying modulation on a beam of light. Digital micromirror devices (DMDs), which are an example of spatial light modulators, are used as reflective digital light switches in a variety of applications, including digital lithography. For digital lithography, the DMD is generally combined with other image processing components, such as memory, a light source and optics, and used to project images on a photoresist, thereby exposing and printing on the photoresist.

A DMD generally includes several hundred thousand to millions of microscopic mirrors ("micromirrors") arranged in a rectangular array. Each micromirror corresponds to a single pixel of the image to be printed and can be tilted at various angles about a hinge. Depending on the tilt angle of the micromirror, the micromirror is in an "on" or "off" state. In the on state, light is reflected from the DMD into a lens and ultimately a pixel is projected onto the photoresist. In the off state, light is directed elsewhere, such as a light dump, and the projected pixel appears dark.

The DMD generally has a convex cylindrical shape. The curvature of the DMD causes the phase interference angle across the DMD to change, leading to phase angle error. The phase interference non-uniformity as a result of the curvature of the DMD negatively impacts printing performance, such as by creating scan mura on the substrates.

Thus, there is a need in the art for improved mount apparatuses for digital micromirror devices of digital lithography systems and methods of mounting the digital micromirror devices.

SUMMARY

In one embodiment, a mount apparatus is provided. The mount apparatus includes a mounting frame including a pair of contact pads. The mounting apparatus further includes an interposer operable to be in contact with a mounting frame top surface and a DMD top surface. The mount apparatus further includes a printed circuit board (PCB) operable to be in contact with an interposer top surface. The mount apparatus further includes a force spreader plate operable to be in contact with a PCB top surface. The mount apparatus further includes a heat sink operable to be in contact with the force spreader plate. The mount apparatus further includes a fastener disposed through a plurality of through holes. The fastener operable to couple the mounting frame, the interposer, the PCB, the force spreader plate, and the heat sink together. The plurality of through holes are operable to be disposed through the mounting frame, the interposer, the PCB, the force spreader plate, and the heat sink.

In another embodiment, an image projection system is provided. The image projection system includes a light source operable to produce a beam and a digital micromirror device (DMD). The light source is operable to direct the beam to the DMD. The image projection system further includes a mount apparatus operable to retain the DMD. The mount apparatus includes a mounting frame operable to retain a digital micromirror device (DMD). The mounting frame includes a pair of contact pads in contact with a DMD outer surface of the DMD. The mount apparatus further includes an interposer in contact with a mounting frame top surface and a DMD top surface and a printed circuit board (PCB) in contact with an interposer top surface. The mount apparatus further includes a force spreader plate in contact with a PCB top surface and a heat sink in contact with the force spreader plate. The mount apparatus further includes a fastener disposed through a plurality of through holes. The fastener is operable to couple the mounting frame, the interposer, the PCB, the force spreader plate, and the heat sink together. The plurality of through holes are disposed through the mounting frame, the interposer, the PCB, the force spreader plate, and the heat sink. The image projection system further includes a projection lens disposed below the DMD. The projection lens is operable to project a plurality of write beams reflected from the DMD.

In yet another embodiment, a method is provided. The method includes positioning a digital micromirror device (DMD) in a mounting frame. The mounting frame includes a pair of contact pads to be in contact with the DMD. The method further includes positioning an interposer, a printed circuit board (PCB), a force spreader plate, and a heat sink in a stack over a DMD top surface of the DMD. The method further includes installing a fastener through a plurality of through holes to couple the mounting frame, the interposer, the PCB, the force spreader plate, and the heat sink together to form a mount apparatus. The fastener includes a plurality of screws threaded through the plurality of through holes and threads disposed in the mounting frame. The method further includes adjusting a flatness of the DMD. The adjusting the flatness of the DMD includes torqueing or loosening the plurality of screws to increase or decrease a force of the pair of contact pads on the DMD. The method further includes annealing the mount apparatus and the DMD.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatuses for processing one or more substrates, and more specifically mount apparatuses for digital micromirror devices of digital lithography systems and methods of mounting the digital micromirror devices. The mount apparatus includes a mounting frame with a pair of contact pads. The mounting apparatus further includes an interposer operable to be in contact with a mounting frame top surface and a DMD top surface. The mount apparatus further includes a printed circuit board (PCB) operable to be in contact with an interposer top surface. The mount apparatus further includes a force spreader plate operable to be in contact with a PCB top surface. The mount apparatus further includes a heat sink operable to be in contact with the force spreader plate. The mount apparatus further includes a fastener disposed through a plurality of through holes. The fastener operable to couple the mounting frame, the interposer, the PCB, the force spreader plate, and the heat sink together. The plurality of through holes are operable to be disposed through the mounting frame, the interposer, the PCB, the force spreader plate, and the heat sink.

Figure 1:
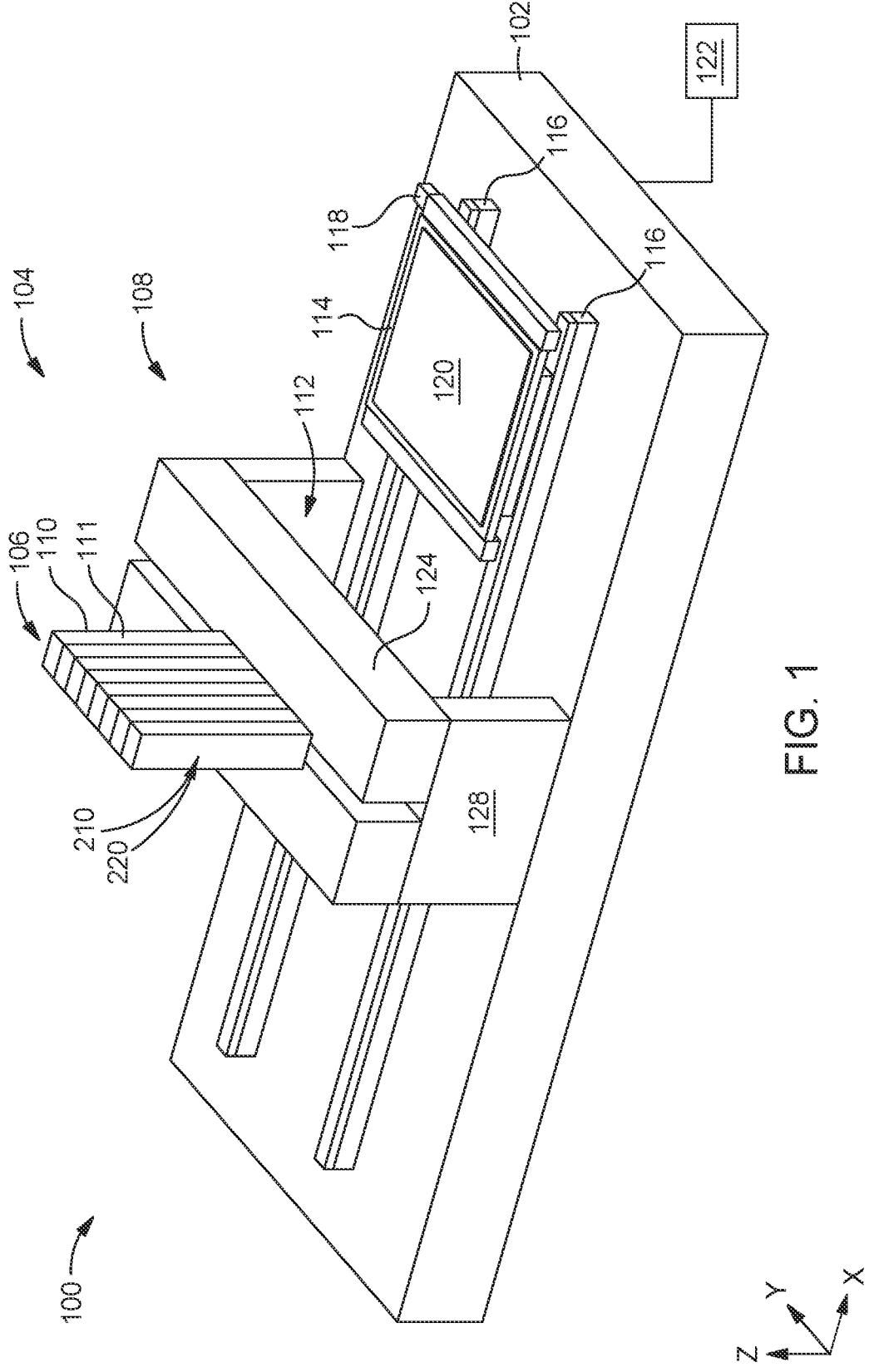
FIG. 1 is a perspective view of a digital lithography system according to embodiments disclosed herein.

FIG. 1 is a perspective view of a digital lithography system 100, which may benefit from embodiments described herein. The digital lithography system 100 includes a stage 114 and a processing apparatus 104. The stage 114 is supported by a pair of tracks 116 disposed on a slab 102. A substrate 120 is supported by the stage 114. The stage 114 moves along the pair of tracks 116 in the X direction as indicated by the coordinate system shown in FIG. 1. The stage 114 also moves in the Y-direction for processing and/or indexing a substrate 120. The stage 114 is capable of independent operation and can scan the substrate 120 in one direction and step in the other direction. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. A program (or computer instructions), which may be referred to as an imaging program, readable by the controller 122, determines which tasks are performable on a substrate. The program includes a mask pattern data and code to monitor and control the processing time and substrate position. The mask pattern data corresponds to a pattern to be written into the photoresist using the electromagnetic radiation.

The substrate 120 comprises any suitable material, for example, glass, which is used as part of a flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The support 108 includes a pair of risers 128, disposed on the slab 102, supporting two or more bridges 124. The pair of risers 128 and bridges 124 form an opening 112 for the pair of tracks 116 and the one or more stages 114 to pass under the processing unit 106. The processing unit 106 is supported by the support 108. The processing unit 106 includes a plurality of image projection systems (IPSs) 110. The plurality of IPSs 110 are disposed in a case 111. The plurality of IPSs 110 are supported by one or more bridges 124. The plurality of image projection systems 110 each include a mount apparatus 220 (as shown and described in FIGS. 3A and 3B) that is operable to retain a DMD 210 (as shown in FIG. 2).

In one embodiment, which can be combined with other embodiments described herein, the processing unit 106 contains as many as 84 IPS's 110. Each IPS 110 includes a spatial light modulator. The spatial light modulator includes, but is not limited to, microLEDs, OLEDs, digital micromirror devices (DMDs), liquid crystal displays (LCDs), and vertical-cavity surface-emitting lasers (VCSELs). The components of each of the IPS 110 vary depending on the spatial light modulator being used.

Figure 2:
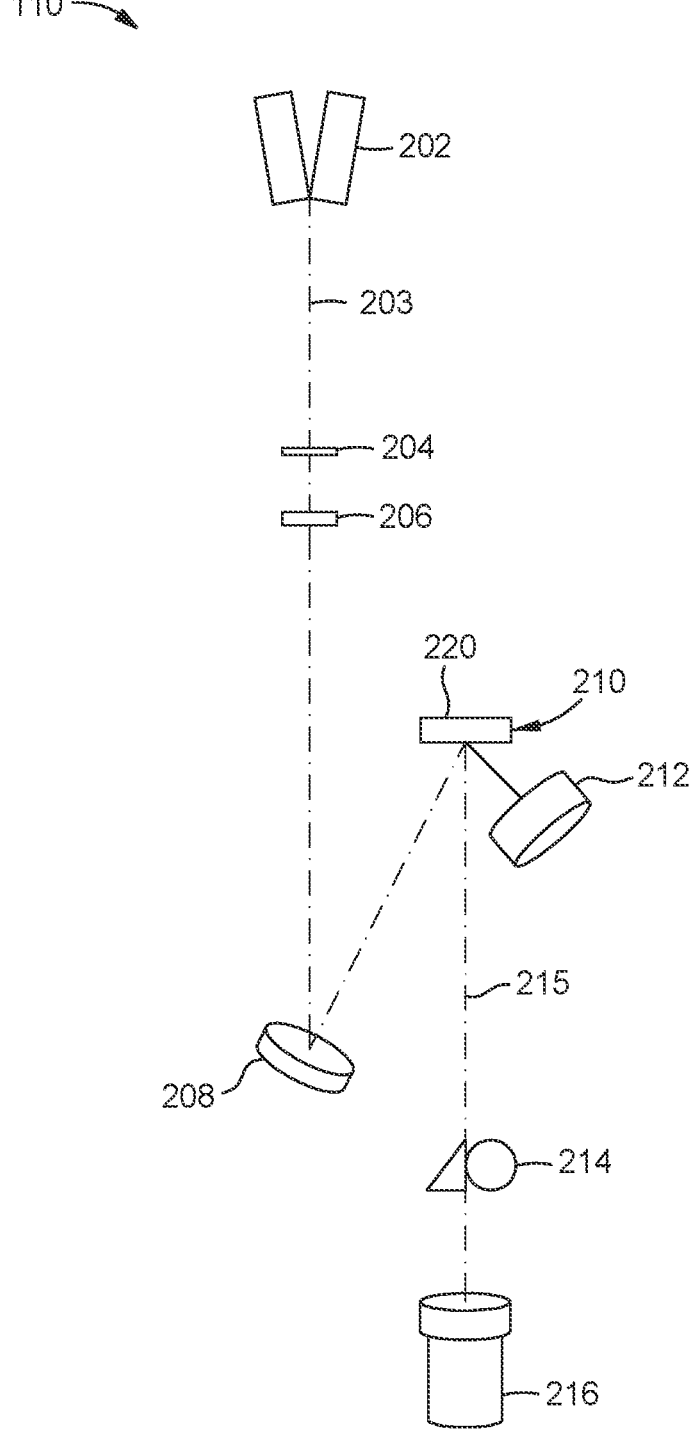
FIG. 2 is a perspective schematic view of one image projection system of the plurality of image projection systems of FIG. 1 according to embodiments described herein.

FIG. 2 is a perspective schematic view of one image projection system 110 of the plurality of image projection systems 110 of FIG. 1. The image projection system 110 may include a light source 202, an aperture 204, a lens 206, a mirror 208, a digital micromirror device (DMD) 210, a light dump 212, a camera 214, and a projection lens 216. The light source 202 may be a light emitting diode (LED) or a laser, and the light source 202 may be capable of producing a light having predetermined wavelength. In one embodiment, the predetermined wavelength is in the blue or near ultraviolet (UV) range, such as less than about 450 nm. The mirror 208 may be a spherical mirror. The projection lens 216 may be an image magnifying or image reducing objective lens of any desired magnification. The DMD 210 may include a plurality of mirrors, and the number of mirrors may correspond to the resolution of the projected image. In one embodiment, the DMD 210 includes 1920×1080 mirrors, which represent the number of pixels of a high definition television or other flat panel displays. The image projection system 110 includes a mount apparatus 220 (as shown and described in FIGS. 3A and 3B) that is operable to retain the DMD 210.

During operation, a beam 203 having a predetermined wavelength, such as a wavelength in the blue to ultra-violet range, is produced by the light source 202. The beam 203 is reflected to the DMD 210 by the mirror 208. The DMD 210 includes a plurality of mirrors that may be controlled individually, and each mirror of the plurality of mirrors of the DMD 210 may be at an "on" position or "off" position, based on the mask data provided to the DMD 210 by the controller (not shown). When the beam 203 reaches the mirrors of the DMD 210, the mirrors that are at "on" position reflect the beam 203, i.e., forming the plurality of write beams 215, to the projection lens 216. The projection lens 216 then projects the write beams 215 to a surface of the substrate 120 (shown in FIG. 1). The mirrors that are at the "off" position reflect the beam 203 to the light dump 212 instead of the surface of the substrate 120.

Figure 3A:
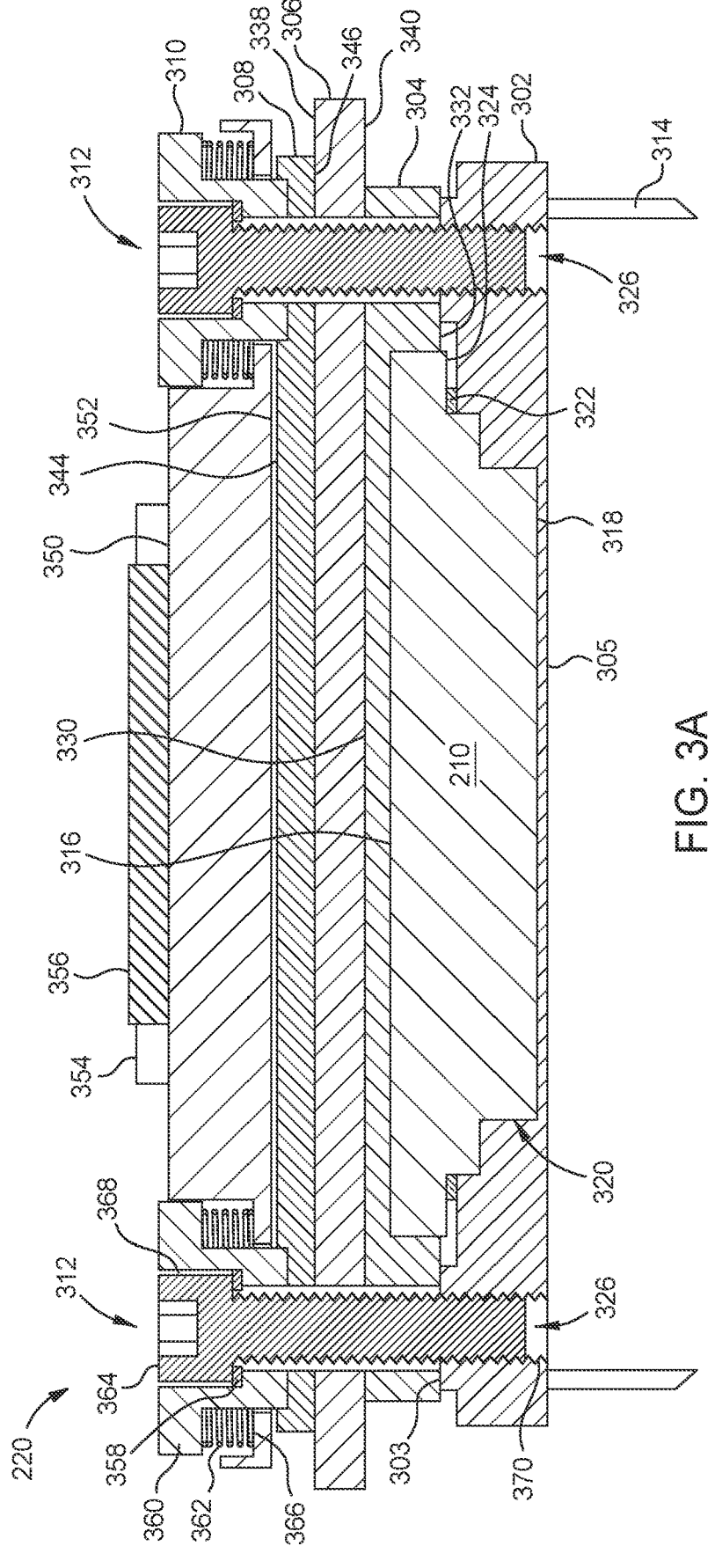
FIG. 3A is a schematic, cross-sectional view of a mount apparatus for a digital micromirror device (DMD) according to embodiments described herein.
Figure 3B:
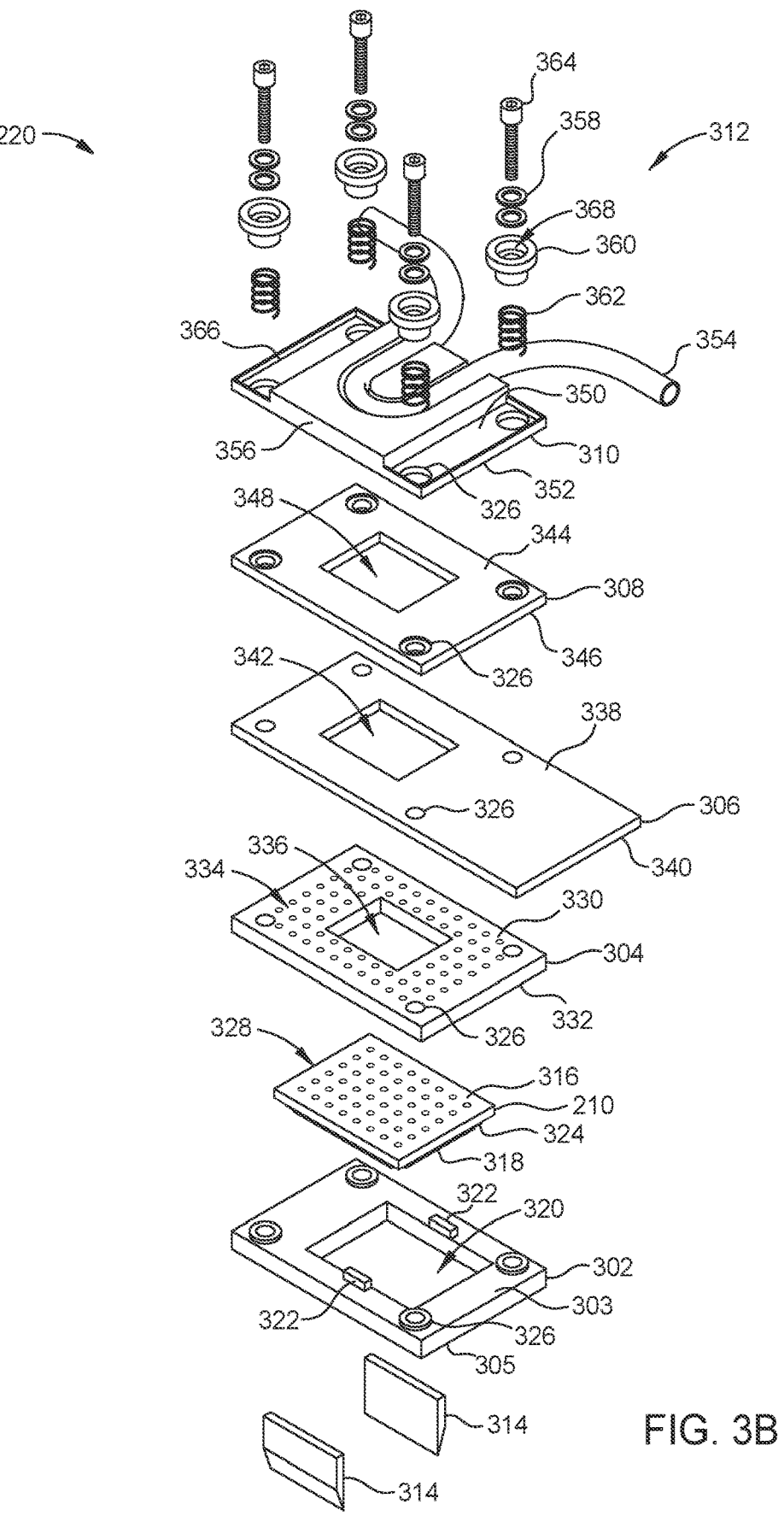
FIG. 3B is a schematic, exploded view of a mount apparatus for a digital micromirror device (DMD) according to embodiments described herein.

FIG. 3A is a schematic, cross-sectional view of a mount apparatus 220 for a digital micromirror device (DMD) 210. FIG. 3B is a schematic, exploded view of a mount apparatus 220 for a digital micromirror device (DMD) 210. As described above, the mount apparatus 220 is operable to retain the DMD 210 within the image projection system 110 shown in FIG. 2. Utilizing the mount apparatus 220 allows the DMD 210 to transition from a convex state to a flattened state, as shown in FIGS. 3A and 3B. The convex cylindrical shape can produces scan mura on the substrate 120 during a printing process. By mechanically stressing the DMD 210 with the mount apparatus 220, the scan mura may be reduced by improving phase interference uniformity. Mechanically stressing the DMD 210 will increase the flatness of the DMD 210. The difference between the average slopes of two opposing edges of the DMD 210 is calculated as the DMD 210 is mechanically stressed. The minimum value of the difference between the average slopes of two opposing edges of the DMD 210 is monitored to ensure flatness of the DMD 210. The mechanical stressing is achieved by retaining the DMD 210 in the mount apparatus 220. The mount apparatus 220 includes a mounting frame 302, an interposer 304, a printed circuit board (PCB) 306, a force spreader plate 308, a heat sink 310, a fastener 312, and a pair of bonding mounts 314.

The DMD 210 includes a DMD outer surface 324, a DMD top surface 316 and a DMD bottom surface 318. The DMD 210 is positioned on the mounting frame 302 and is supported by the mounting frame 302. The mounting frame 302 includes a frame top surface 303 and a frame bottom surface 305. The mounting frame 302 has a frame opening 320 disposed therethrough. The DMD bottom surface 318 of the DMD 210 is positioned in the frame opening 320. The mounting frame 302 further includes a pair of contact pads 322. The pair of contact pads 322 are positioned adjacent to the frame opening 320 and on opposite sides of the frame opening 320. The pair of contact pads 322 contact the DMD outer surface 324 of the DMD 210. The pair of contact pads 322 are operable to apply pressure to the DMD 210. The mounting frame 302 includes a plurality of through holes 326. In one embodiment, which can be combined with other embodiments described herein, the mounting frame 302 is a stainless steel, titanium, steel, or plated steel material. For example, the mounting frame 302 is a 303 stainless steel material.

The DMD 210 further includes a plurality of first contacts 328 on the DMD top surface 316. In one embodiment, which can be combined with other embodiments described herein, the first contacts 328 are gold contacts. The interposer 304 includes an interposer top surface 330 and an interposer bottom surface 332. The interposer 304 includes a plurality of second contacts 334. In one embodiment, which can be combined with other embodiments described herein, the second contacts 334 are gold contacts. The interposer bottom surface 332 is positioned to be in contact with the DMD top surface 316 and the frame top surface 303. The plurality of first contacts 328 are in contact with the plurality of second contacts 334. The plurality of first contacts 328 in contact with the plurality of second contacts 334 are conductively connected. Electrical signals are operable to pass through the interposer 304 and onto the PCB 306 via the plurality of first contacts 328 in contact with the plurality of second contacts 334. The interposer 304 has an interposer opening 336 disposed therethrough. The interposer 304 includes a plurality of through holes 326. In one embodiment, which can be combined with other embodiments described herein, the interposer 304 is a polymer material. For example, the interposer 304 is a liquid crystal polymer material.

The PCB 306 includes a PCB top surface 338 and a PCB bottom surface 340. The PCB 306 has a PCB opening 342 disposed therethrough. The PCB bottom surface 340 is in contact with the interposer top surface 330. The PCB 306 may receive electrical signals from the DMD 210 or provide electrical signals to the DMD 210 via the plurality of first contacts 328 in contact with the plurality of second contacts 334. The PCB 306 includes a plurality of through holes 326.

The force spreader plate 308 includes a force spreader plate top surface 344 and a force spreader plate bottom surface 346. The force spreader plate 308 has a force spreader plate opening 348 disposed therethrough. The force spreader plate bottom surface 346 is in contact with the PCB top surface 338. The force spreader plate 308 distributes the force to protect the PCB 306. The force spreader plate 308 is operable to stiffen the mount apparatus 220. The force spreader plate 308 includes a plurality of through holes 326. In one embodiment, which can be combined with other embodiments described herein, the force spreader plate 308 is a stainless steel, titanium, steel, or plated steel material. For example, the force spreader plate 308 is a 303 stainless steel material.

The heat sink 310 includes a heat sink top surface 350 and a heat sink bottom surface 352. The heat sink bottom surface 352 is in contact with the force spreader plate top surface 344. The heat sink 310 includes a cooling tube 354. The cooling tube 354 is coupled to the heat sink top surface 350 via a cooling interface 356. The cooling tube 354 is operable to flow a cooling fluid through the cooling interface 356. For example, the cooling tube 354 may flow water through the cooling interface 356. The cooling tube 354 is operable to remove excess heat from the DMD 210. The interposer opening 336, PCB opening 342, and the force spreader plate opening 348 allows the heat sink 310 to contact the DMD 210 such that the DMD 210 is cooled. The heat sink 310 includes a plurality of through holes 326. In one embodiment, which can be combined with other embodiments described herein, the heat sink 310 is a conductive material. For example, the heat sink 310 is a copper, plated copper, aluminum, or plated aluminum material.

The fastener 312 includes a plurality of washers 358, a plurality of deformation bushings 360, a plurality of springs 362, and a plurality of screws 364. Each of the plurality of deformation bushings 360 are positioned in each of the plurality of through holes 326. The plurality of deformation bushings 360 are positioned in the plurality of through holes 326 to be in contact with the force spreader plate 308. Each of the plurality of springs 362 are disposed between the plurality of deformation bushings 360 and a lip 366 formed in the heat sink 310. The plurality of washers 358 are disposed in a cavity 368 of each of the plurality of deformation bushings 360. The plurality of screws 364 are positioned through each of the cavities 368 and through the plurality of through holes 326. The plurality of screws 364 are operable to be threaded through threads 370. The threads 370 are disposed along the plurality of through holes 326 in the mounting frame 302. The plurality of screws 364 are operable to be torqued to provide the required pressure that flattens the DMD 210.

The pair of bonding mounts 314 are coupled to the frame bottom surface 305. In one embodiment, which can be combined with other embodiments described herein, the pair of bonding mounts 314 are coupled to the frame bottom surface 305 with the plurality of screws 364. The pair of bonding mounts 314 are operable to couple the mount apparatus 220 to components of a plurality of image projection systems (IPSs) 110 (shown in FIG. 2).

Figure 4:
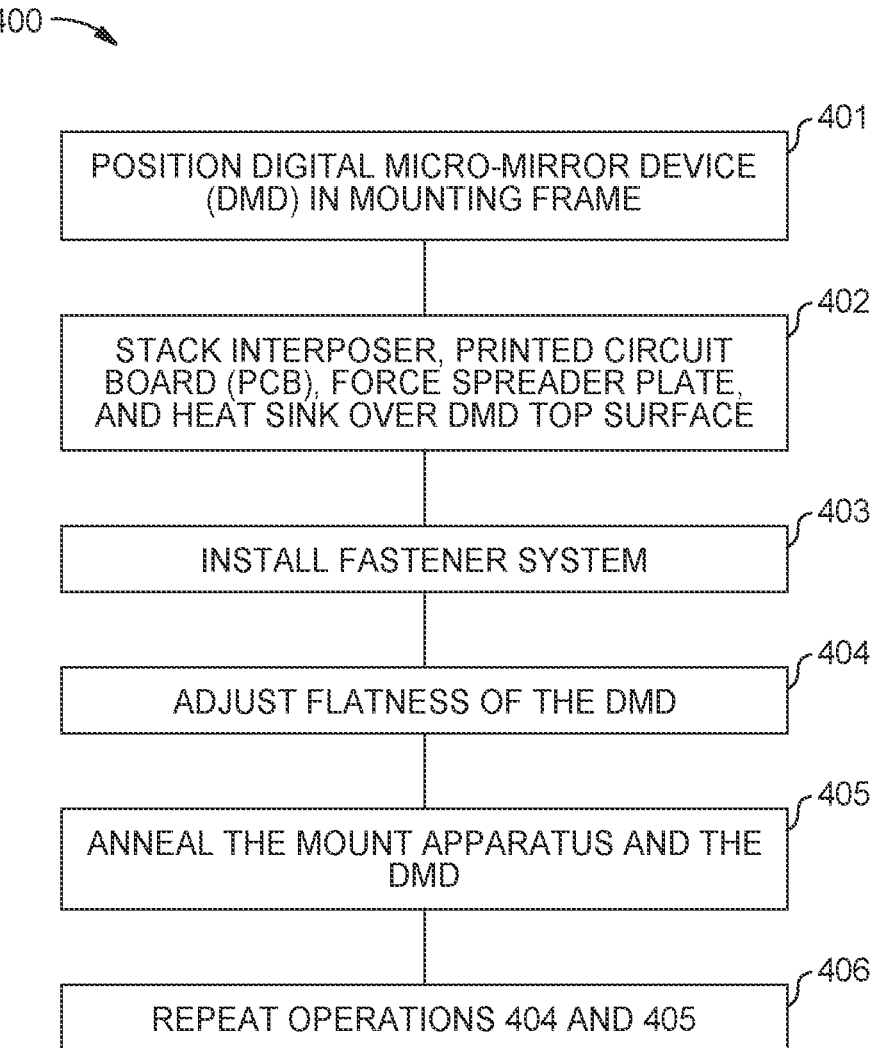
FIG. 4 is a flow diagram of a method of mounting a digital micromirror device (DMD) in a mounting device according to embodiments described herein.

FIG. 4 is a flow diagram of a method 400 of mounting a digital micromirror device (DMD) 210 in a mount apparatus 220. The mount apparatus 220 and the DMD 210 are disposed in each of a plurality of image projection systems (IPSs) 110. A peak to valley curvature of the DMD 210 causes a phase interference angle to change across the DMD 210. The change in phase interference angle leads to scan mura on a substrate 120 during the printing process. The method 400 described herein improves phase interference angle uniformity across the DMD 210 by increasing the flatness of the DMD 210.

At operation 401, the DMD 210 is positioned in a mounting frame 302. The mounting frame includes a pair of contact pads 322 that are positioned in contact with the DMD 210. At operation 402, an interposer 304, a printed circuit board (PCB) 306, a force spreader plate 308, and a heat sink 310 are stacked over a DMD top surface 316 of the DMD 210.

At operation 403, a fastener 312 is installed. The fastener 312 couples the mounting frame 302, the interposer 304, the printed circuit board (PCB) 306, the force spreader plate 308, and the heat sink 310 together. The fastener 312 provides a force such that the pair of contact pads 322 are pressed against the DMD 210. A plurality of screws 364 of the fastener 312 are disposed through a plurality of through holes 326. The plurality of through holes 326 are disposed through the mounting frame 302, the interposer 304, the printed circuit board (PCB) 306, the force spreader plate 308, and the heat sink 310. The force is applied by threading the plurality of screws 364 through threads 370 in the mounting frame 302. The force flattens the DMD 210 such that the phase interference angle uniformity is improved. For example, the phase interference angle uniformity is improved by about 75% to about 85%. For example, the phase interference uniformity may improve from between about 5° and about 6° to about 1°.

At operation 404, the flatness of the DMD 210 is adjusted. The flatness of the DMD 210 may be adjusted by torqueing or loosening the plurality of screws 364. Adjusting the torque of the plurality of screws 364 will adjust the flatness of the DMD 210 with a first force path and a second force path. The first force path and the second force path are directed to each of the pair of contact pads 322. The first force path achieved by torqueing the plurality of screws 364 such that the mounting frame 302 is pulled toward the DMD 210, the DMD 210 is pulled to the interposer 304, and the interposer 304 is pulled to the PCB 306 and the force spreader plate 308. Each of the plurality of screws 364 are disposed through a cavity 368 of a plurality of deformation bushings 360. The plurality of deformation bushings 360 are pulled by the torque force which results in the compression force toward the pair of contact pads 322. The second force path is achieved by the plurality of deformation bushings 360 compressing a plurality of springs 362 surrounding each of the plurality of deformation bushings 360. The compression of the plurality of springs 362 pushes the heat sink 310 toward the pair of contact pads 322. In one embodiment, which can be combined with other embodiments described herein, the first force path and the second force path apply a different amount of force to the DMD 210. For example, the first force path may apply about 600 N of force and the second force path may apply about 55 N of force.

In one embodiment, which may be combined with other embodiments described herein, an interferometer is utilized to determine and monitor the flatness of the DMD 210 during the method 400. The flatness of the DMD 210 may be increased by torqueing the plurality of screws 364. The flatness may be decreased by loosening the plurality of screws 364. Thus, the flatness of the DMD 210 may be tuned by torqueing or loosening the plurality of screws 364. The plurality of screws 364 may provide a torque between about 0.1 Nm and about 0.6 Nm.

At operation 405, the mount apparatus 220 and the DMD 210 are annealed. The mount apparatus 220 and the DMD 210 are annealed at a temperature of about 55° C. and about 65° C. The mount apparatus 220 and the DMD 210 are annealed for at least 60 hours. The annealing process accelerates mechanical creep of the mount apparatus 220. For example, mechanical creep of the interposer 304 is accelerated. Mechanical creep that may occur at room temperature is negligible after the annealing process is performed. Thus, the mechanical stability of the mount apparatus 220 is improved after the annealing of the mount apparatus 220 and the DMD 210.

At optional operation 406, operation 404 and 405 may be repeated. The flatness of the DMD 210 may be measured with an interferometer to ensure the desired flatness has been achieved. The operation 405 may alter the flatness of the DMD 210, thus adjusting the flatness with the plurality of screws 364 may be necessary. The mount apparatus 220 and the DMD 210 may be annealed again. Operation 406 may be repeated until the desired flatness of the DMD 210 is achieved.

In summation, mount apparatuses for digital micromirror devices of digital lithography systems and methods of mounting the digital micromirror devices are described herein. The mount apparatuses described herein retain spatial light modulators, such as DMDs. The mount apparatus includes a mounting frame, an interposer, a printed circuit board (PCB), a force spreader plate, a heat sink, a fastener, and a pair of bonding mounts. The mount apparatus enables the flattening of the DMD by providing a force such that the pair of contact pads contact the DMD. The benefits of the DMD being retained in the mount apparatus include improvement of phase interference uniformity and thus, improvement of printing performance.

While the foregoing is directed to embodiments of the present disclosure, other and further embodiments of the disclosure may be devised without departing from the basic scope thereof, and the scope thereof is determined by the claims that follow.

What is claimed is:
1. A mount apparatus, comprising:
   a mounting frame operable to retain a digital micromirror device (DMD), the mounting frame including contact pads that are operable to directly contact a DMD outer surface of the DMD;

an interposer operable to be in contact with a mounting frame top surface;

a printed circuit board (PCB) operable to be in contact with an interposer top surface;

a force spreader plate operable to be in contact with a PCB top surface;

a heat sink operable to be in contact with the force spreader plate; and a fastener system disposed through a plurality of through holes, the fastener system operable to couple the mounting frame, the interposer, the PCB, the force spreader plate, and the heat sink together, the plurality of through holes operable to be disposed through the mounting frame, the interposer, the PCB, the force spreader plate, and the heat sink, wherein the contact pads are operable to apply direct pressure to the DMD outer surface from the fastener system.

2. The mount apparatus of claim 1, wherein the fastener system comprises:

a plurality of washers;

a plurality of deformation bushings;

a plurality of springs; and a plurality of screws.

3. The mount apparatus of claim 2, wherein each of the plurality of deformation bushings are operable to be positioned in one of the plurality of through holes.

4. The mount apparatus of claim 3, wherein the plurality of springs are operable to be positioned between the plurality of deformation bushings and a lip formed in the heat sink.

5. The mount apparatus of claim 4, wherein each of the plurality of screws are operable to be disposed through a cavity of each of the plurality of deformation bushings, the plurality of screws threaded through threads in the mounting frame.

6. The mount apparatus of claim 1, wherein the interposer includes a plurality of second contacts, the plurality of second contacts operable to be in contact with a plurality of first contacts of the DMD.

7. The mount apparatus of claim 1, further comprising a pair of bonding mounts operable to be coupled to a frame bottom surface of the mounting frame.

8. An image projection system, comprising:

a light source operable to produce a beam;

a digital micromirror device (DMD), wherein the light source is operable to direct the beam to the DMD;

a mount apparatus operable to retain the DMD, the mount apparatus comprising:

a mounting frame operable to retain a digital micromirror device (DMD), the mounting frame including contact pads in direct contact with a DMD outer surface of the DMD;

an interposer in contact with a mounting frame top surface and a DMD top surface;

a printed circuit board (PCB) in contact with an interposer top surface;

a force spreader plate in contact with a PCB top surface;

a heat sink in contact with the force spreader plate; and a fastener system disposed through a plurality of through holes, the fastener system operable to couple the mounting frame, the interposer, the PCB, the force spreader plate, and the heat sink together, the plurality of through holes disposed through the mounting frame, the interposer, the PCB, the force spreader plate, and the heat sink, wherein the contact pads are operable to apply direct pressure to the DMD outer surface from the fastener system; and a projection lens disposed below the DMD, the projection lens operable to project a plurality of write beams reflected from the DMD.

9. The image projection system of claim 8, wherein the fastener system comprises:

a plurality of washers;

a plurality of deformation bushings;

a plurality of springs; and a plurality of screws.

10. The image projection system of claim 9, wherein each of the plurality of deformation bushings are positioned in one of the plurality of through holes.

11. The image projection system of claim 10, wherein the plurality of springs are positioned between the plurality of deformation bushings and a lip formed in the heat sink.

12. The image projection system of claim 11, wherein each of the plurality of screws are disposed through a cavity of each of the plurality of deformation bushings, the plurality of screws threaded through threads in the mounting frame.

13. The image projection system of claim 8, further comprising a pair of bonding mounts coupled to a frame bottom surface of the mounting frame.

14. A method, comprising:

positioning a digital micromirror device (DMD) in a mounting frame, the mounting frame including a contact pads;

directly contacting a DMD outer surface of the DMD with the contact pads;

positioning an interposer, a printed circuit board (PCB), a force spreader plate, and a heat sink in a stack over a DMD top surface of the DMD;

installing a fastener system through a plurality of through holes to couple the mounting frame, the interposer, the PCB, the force spreader plate, and the heat sink together to form a mount apparatus, the fastener system including a plurality of screws threaded through threads disposed in the mounting frame and the plurality of through holes;

adjusting a flatness of the DMD, the adjusting the flatness of the DMD including torqueing or loosening the plurality of screws to increase or decrease a direct pressure that is applied by the contact pads to the DMD outer surface; and annealing the mount apparatus and the DMD.

15. The method of claim 14, wherein the torqueing the plurality of screws in the threads in the mounting frame increases the flatness of the DMD.

16. The method of claim 14, wherein the adjusting the flatness of the DMD includes utilizing an interferometer to determine the flatness of the DMD and torqueing or loosening based on the flatness of the DMD determined by the interferometer.

17. The method of claim 14, further comprising repeating the adjusting the flatness of the DMD after the annealing the mount apparatus and the DMD.

18. The method of claim 14, wherein the annealing the mount apparatus and the DMD includes annealing for about 48 hours to about 60 hours.

19. The method of claim 14, wherein the annealing the mount apparatus and the DMD includes annealing at a temperature of about 55° C. and about 65° C.

* * * * *